(12) United States Patent
Zhao et al.

(10) Patent No.: US 9,406,636 B2
(45) Date of Patent: *Aug. 2, 2016

(54) INTERPOSER PACKAGE-ON-PACKAGE STRUCTURE

(71) Applicant: Broadcom Corporation, Irvine, CA (US)

(72) Inventors: Sam Ziqun Zhao, Irvine, CA (US); Rezaur Rahman Khan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/715,484

(22) Filed: May 18, 2015

(65) Prior Publication Data

US 2015/0249061 A1   Sep. 3, 2015

Related U.S. Application Data

(63) Continuation of application No. 14/031,000, filed on Sep. 18, 2013, now Pat. No. 9,070,627.

(60) Provisional application No. 61/876,684, filed on Sep. 11, 2013.

(51) Int. Cl.
*H01L 23/02* (2006.01)
*H01L 23/00* (2006.01)
(Continued)

(52) U.S. Cl.
CPC ............ *H01L 24/17* (2013.01); *H01L 21/4853* (2013.01); *H01L 23/3157* (2013.01); *H01L 23/49833* (2013.01); *H01L 24/29* (2013.01); *H01L 24/30* (2013.01); *H01L 24/92* (2013.01); *H01L 23/49811* (2013.01); *H01L 23/49816* (2013.01); *H01L 24/13* (2013.01); *H01L 24/16* (2013.01); *H01L 24/32* (2013.01); *H01L 24/33* (2013.01); *H01L 24/81* (2013.01); *H01L 24/83* (2013.01); *H01L 25/105* (2013.01); *H01L 2224/13111* (2013.01); *H01L 2224/13147* (2013.01); *H01L 2224/16113* (2013.01);
(Continued)

(58) Field of Classification Search
CPC .......... H01L 2924/01079; H01L 2924/01005; H01L 2924/01013; H01L 2924/14
USPC .................. 257/686, 778, 783, 787
See application file for complete search history.

(56) References Cited

U.S. PATENT DOCUMENTS

| 8,492,888 | B2 * | 7/2013 | Chi | .......... H01L 23/16 257/704 |
| 9,070,627 | B2 * | 6/2015 | Zhao | ........ H01L 24/29 |
| 2010/0244223 | A1 * | 9/2010 | Cho | ..... H01L 23/3128 257/690 |

*Primary Examiner* — Quoc Hoang
(74) *Attorney, Agent, or Firm* — McDermott Will & Emery LLP

(57) ABSTRACT

An integrated circuit (IC) package includes an IC die having a first surface and a second surface opposite of the first surface. The IC package includes first contact members coupled to the second surface of the IC die. The IC package includes a bottom substrate having a first surface and a second surface opposite of the first surface, where the first surface of the bottom substrate is coupled to the second surface of the IC die via the first contact members. The IC package includes an interposer substrate coupled to the first surface of the IC die via an adhesive material, where the adhesive material is disposed on at least a surface of the interposer substrate. The IC package includes second contact members coupled along a periphery of the interposer substrate, where the interposer substrate is coupled to the first surface of the bottom substrate via the second contact members.

20 Claims, 14 Drawing Sheets

(51) Int. Cl.
  *H01L 23/31* (2006.01)
  *H01L 21/48* (2006.01)
  *H01L 23/498* (2006.01)
  *H01L 25/10* (2006.01)

(52) U.S. Cl.
  CPC .............. *H01L2224/16225* (2013.01); *H01L 2224/16227* (2013.01); *H01L 2224/29007* (2013.01); *H01L 2224/29012* (2013.01); *H01L 2224/29014* (2013.01); *H01L 2224/29015* (2013.01); *H01L 2224/2919* (2013.01); *H01L 2224/29035* (2013.01); *H01L 2224/29036* (2013.01); *H01L 2224/29078* (2013.01); *H01L 2224/3012* (2013.01); *H01L 2224/30131* (2013.01); *H01L 2224/30141* (2013.01); *H01L 2224/30179* (2013.01); *H01L 2224/32225* (2013.01); *H01L 2224/33181* (2013.01); *H01L 2224/73204* (2013.01); *H01L 2224/81191* (2013.01); *H01L 2224/81815* (2013.01); *H01L 2224/831* (2013.01); *H01L 2224/83101* (2013.01); *H01L 2224/83191* (2013.01); *H01L 2224/83192* (2013.01); *H01L 2224/9221* (2013.01); *H01L 2224/92125* (2013.01); *H01L 2224/92242* (2013.01); *H01L 2225/1058* (2013.01); *H01L 2924/12042* (2013.01); *H01L 2924/14* (2013.01); *H01L 2924/15311* (2013.01); *H01L 2924/15321* (2013.01); *H01L 2924/181* (2013.01); *H01L 2924/3511* (2013.01)

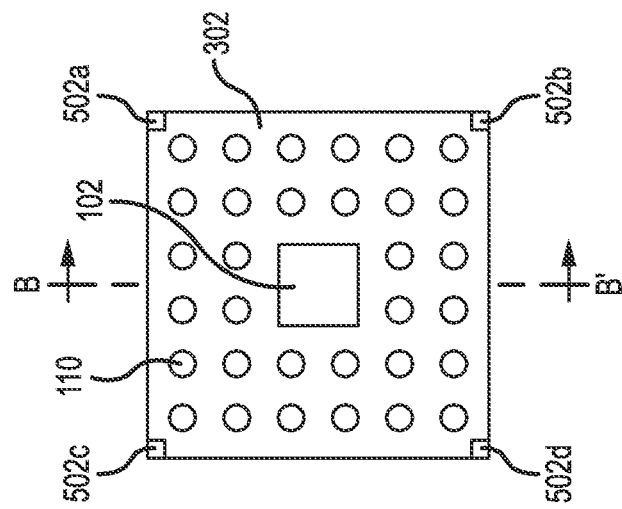
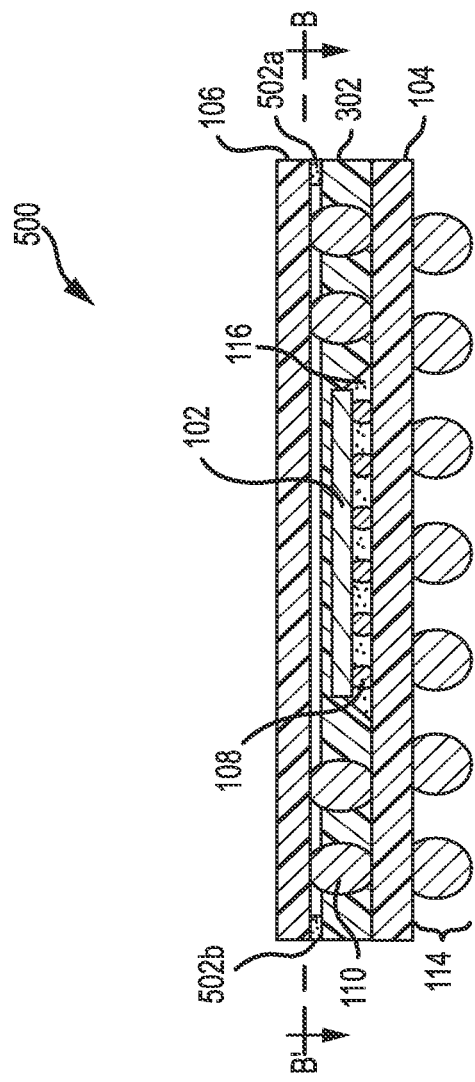
FIG.5B
FIG.5A

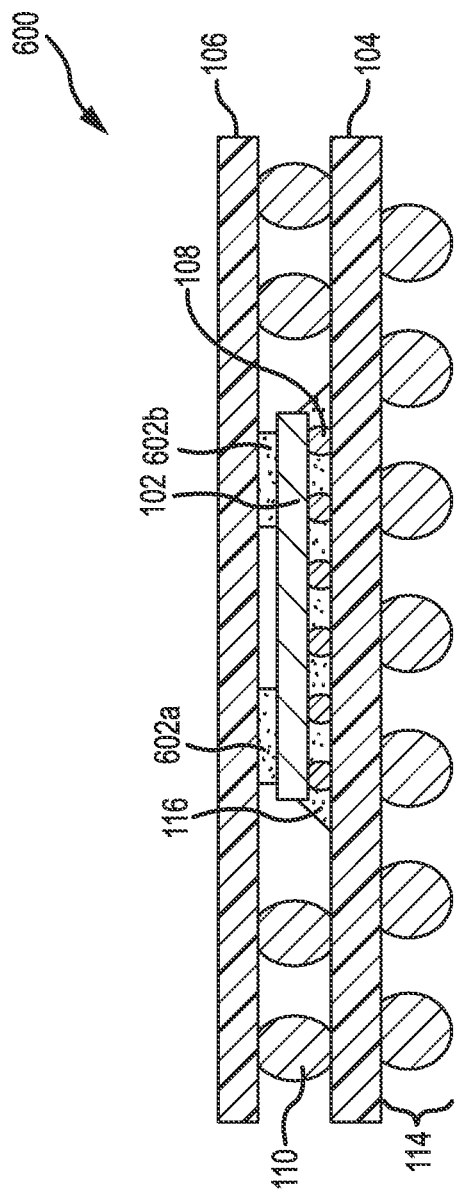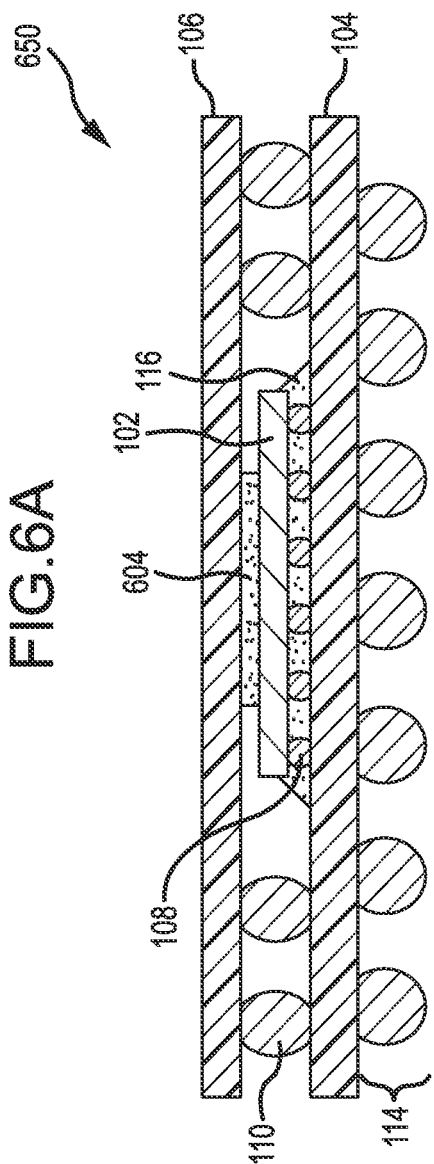

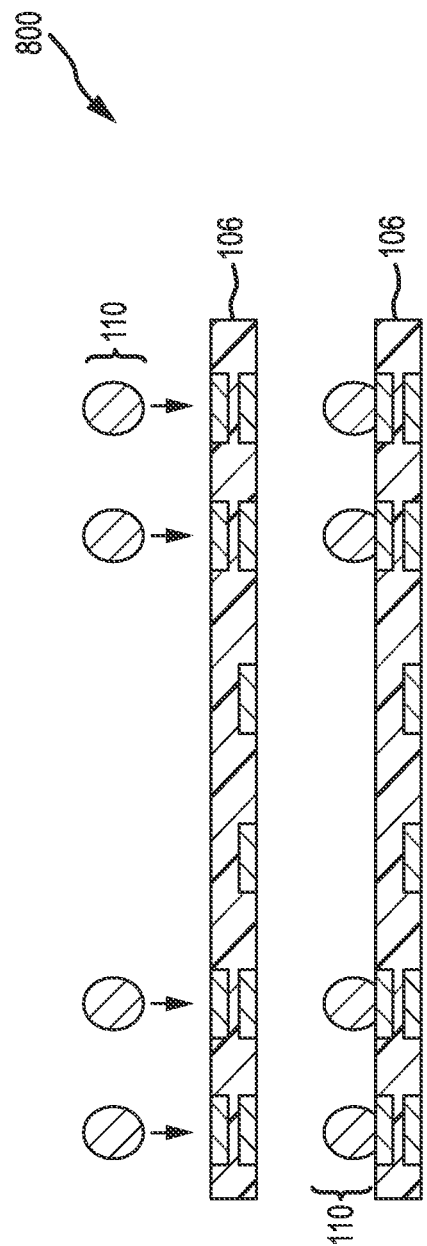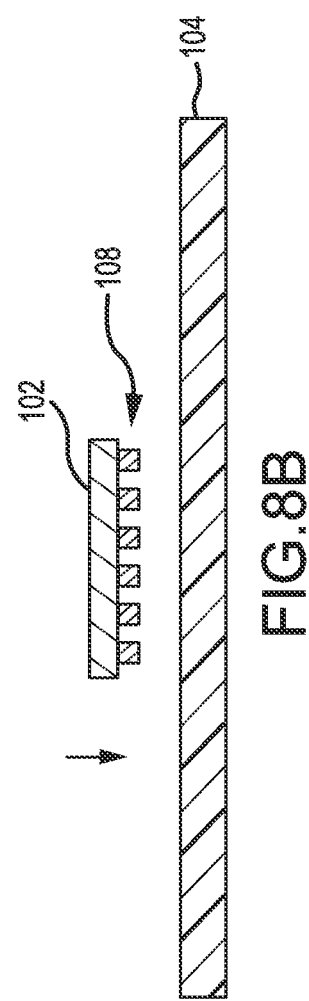

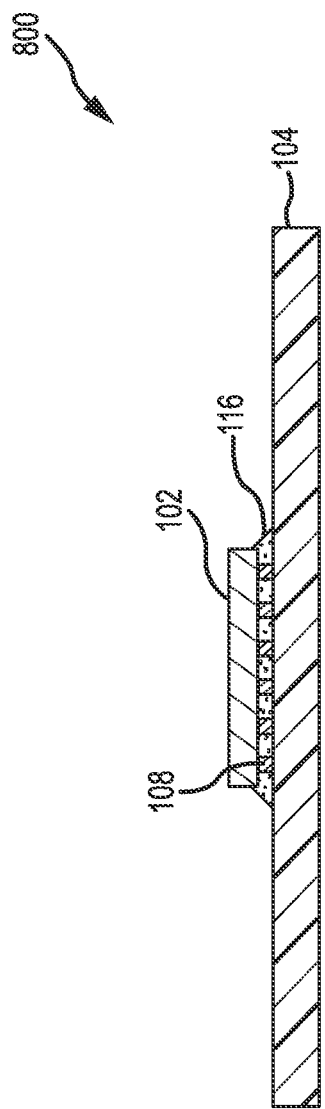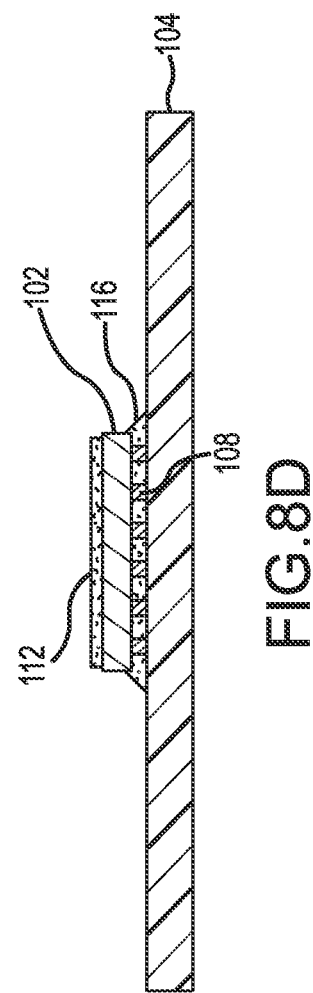

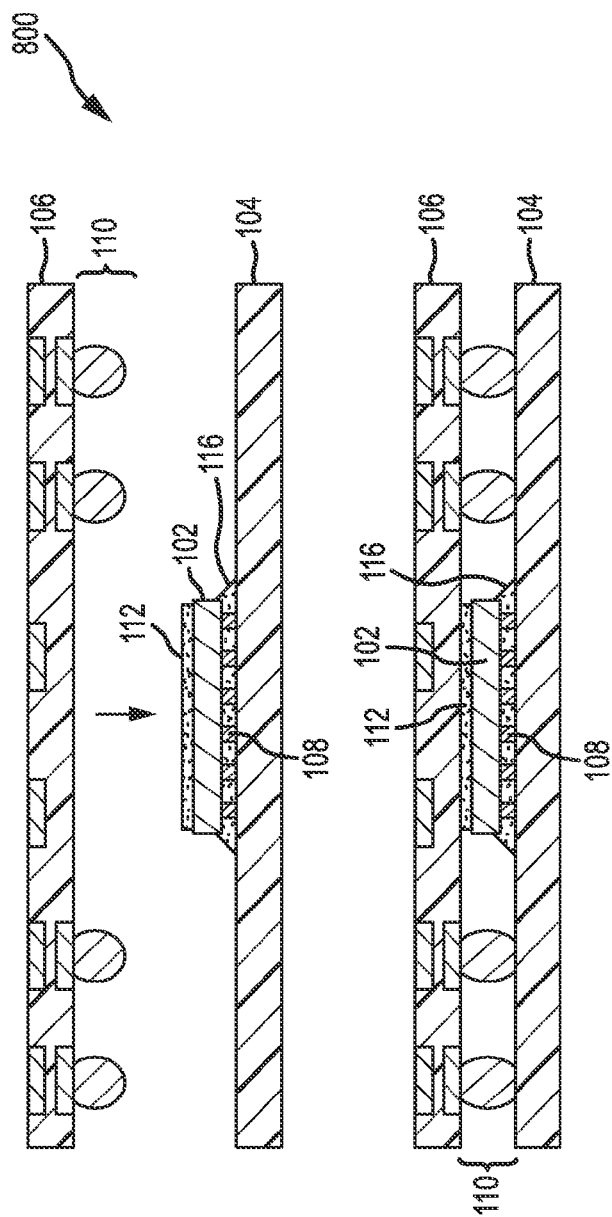
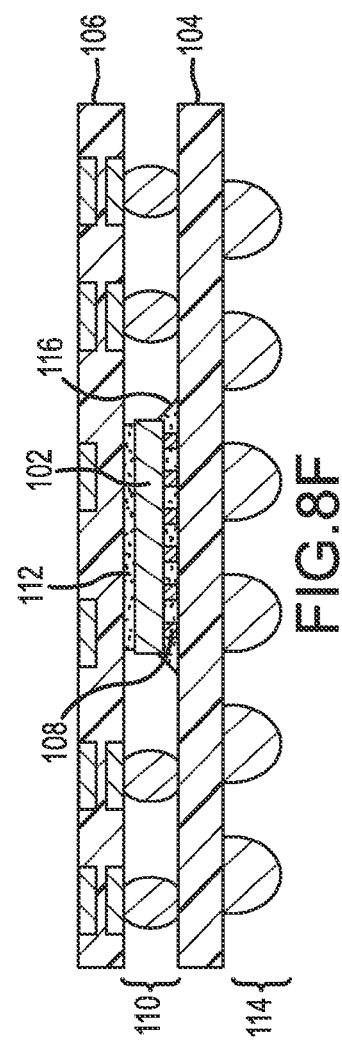
FIG.8E
FIG.8F

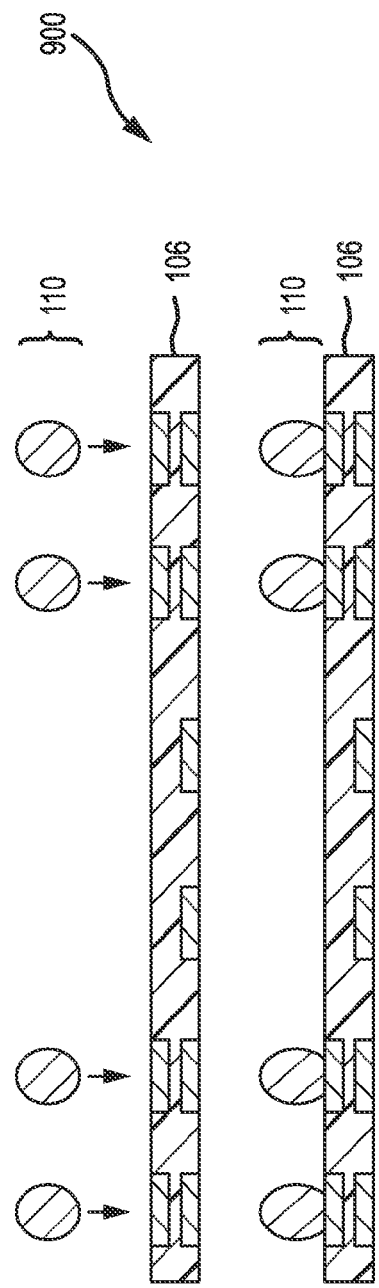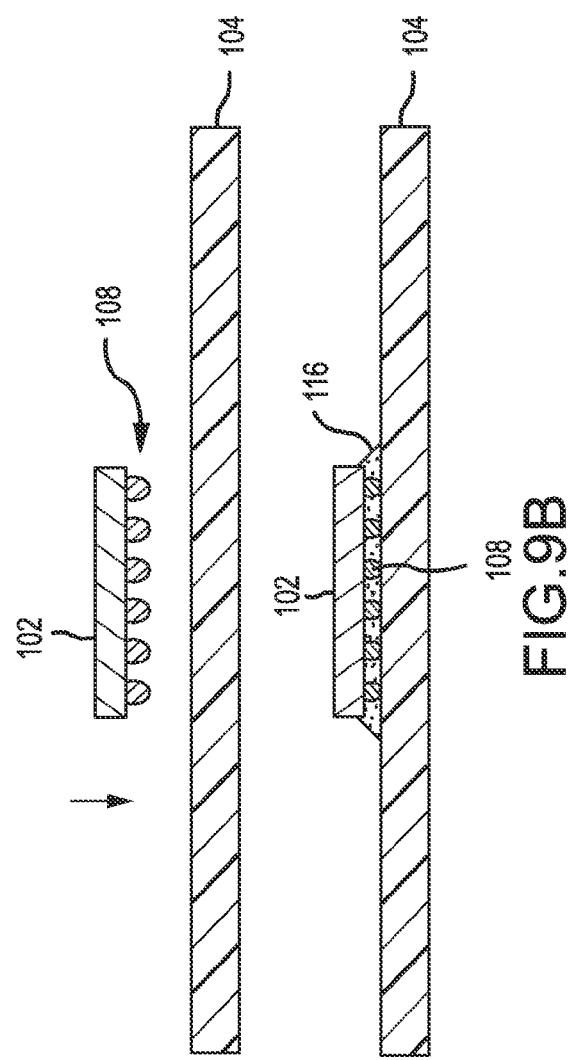
FIG.9A
FIG.9B

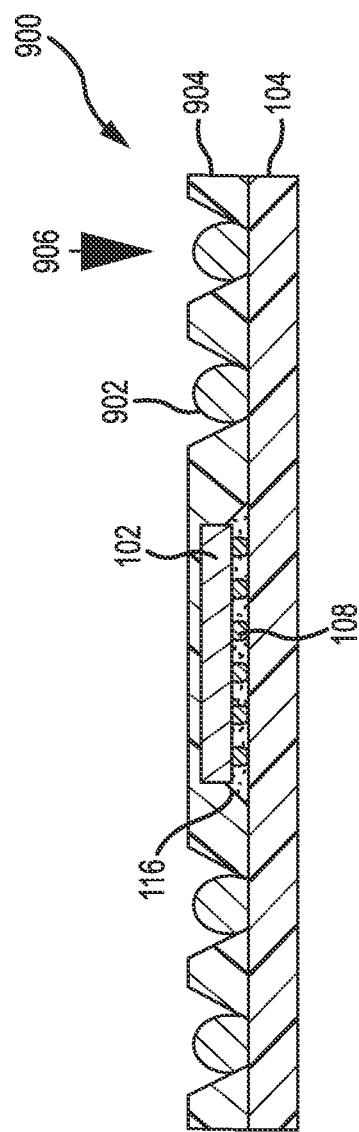
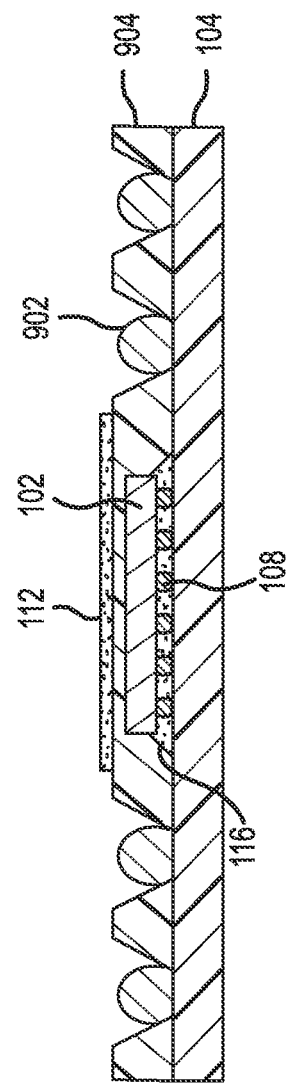
FIG.9E
FIG.9F

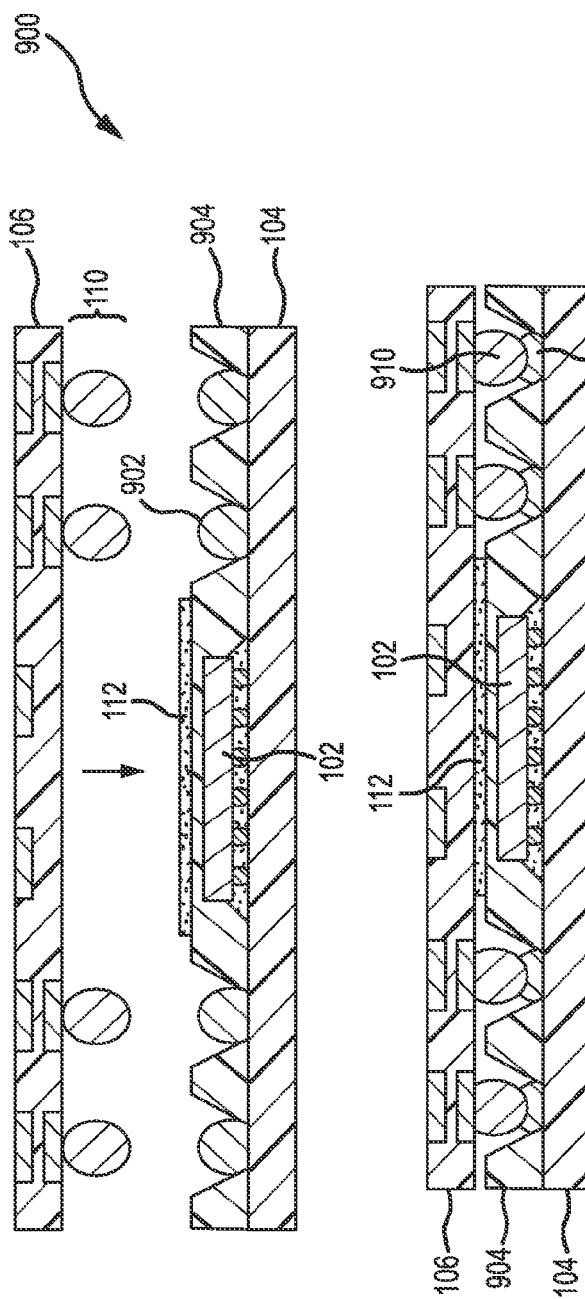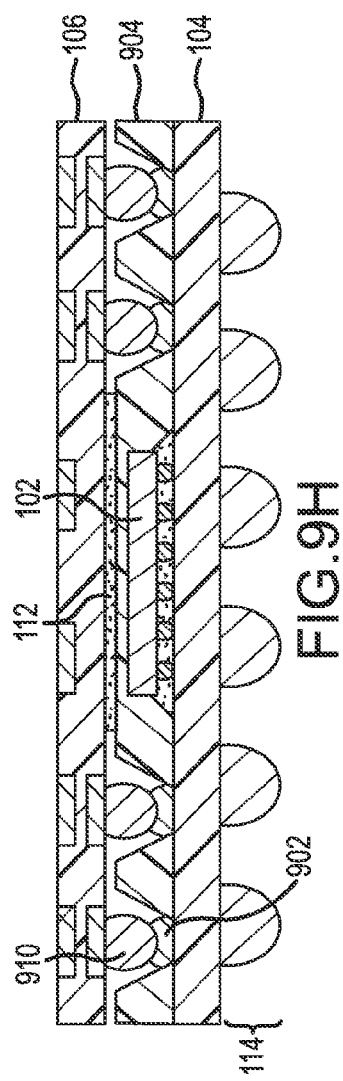

INTERPOSER PACKAGE-ON-PACKAGE STRUCTURE

CROSS-REFERENCE TO RELATED APPLICATIONS

The present application is a continuation of U.S. patent application Ser. No. 14/031,000, entitled "INTERPOSER PACKAGE-ON-PACKAGE STRUCTURE," filed Sep. 18, 2013, which claims the benefit of U.S. Provisional Patent Application Ser. No. 61/876,684, entitled "INTERPOSER PACKAGE-ON-PACKAGE STRUCTURE," filed on Sep. 11, 2013, all of which are hereby incorporated by reference in their entirety for all purposes.

TECHNICAL FIELD

The present disclosure relates to integrated circuit packaging, and more particularly, but not exclusively, to flip chip packaging technology.

BACKGROUND

As mobile devices become more powerful and less power-consuming, integrated circuit packaging technologies are increasingly required to integrate a growing number of electrical components, such as discrete memories and radio frequency front-end components, into a single package solution with a smaller layout footprint and smaller package thickness. Several approaches in designing the integrated circuit packaging technologies have included flip-chip packaging. Flip-chip packaging offers short interconnections between a semiconductor chip and a corresponding substrate, supports multi-layer substrate technology for high-capacitance and low-inductance power delivery and provides efficient cooling mechanisms for heat to be dissipated from transistor junctions to surrounding environments.

BRIEF DESCRIPTION OF THE DRAWINGS

Certain features of the subject technology are set forth in the appended claims. However, for purpose of explanation, several embodiments of the subject technology are set forth in the following figures.

FIGS. 5A-5B illustrate an example of the integrated circuit package illustrated in FIG. 3 in accordance with one or more implementations of the subject technology, where FIG. 5A illustrates a cross-sectional view of the integrated circuit package and FIG. 5B illustrates a top view of a cross-section of the integrated circuit package along a B-B' axis.

FIGS. 6A-6B illustrate cross-sectional views of examples of the integrated circuit package illustrated in FIG. 1 in accordance with one or more implementations of the subject technology.

FIGS. 8A-8F illustrate cross-sectional views of examples in manufacturing the integrated circuit package illustrated in FIG. 1 in accordance with one or more implementations of the subject technology.

FIGS. 9A-9H illustrate cross-sectional views of examples in manufacturing the integrated circuit package illustrated in FIG. 3 in accordance with one or more implementations of the subject technology.

DETAILED DESCRIPTION

Figure 1:
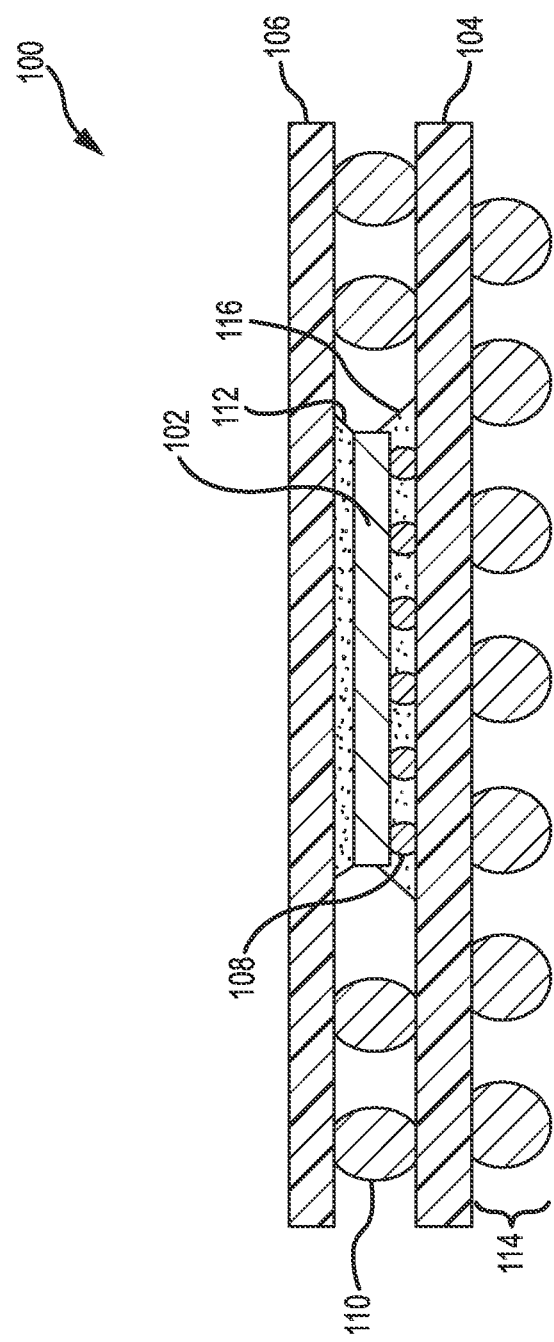
FIG. 1 illustrates a cross-sectional view of an integrated circuit package in accordance with one or more implementations of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

In some approaches, an active die is embedded in a mold compound that is arranged between upper and base substrates with solder balls having a copper core to provide an interconnection between the upper and base substrates. However, this approach includes several shortcomings: (1) the mold compound arranged between the upper and base substrates is required to be assembled at the same time, (2) the total thickness between the substrates including the mold compound is increased, (3) the solder balls with the copper core are more expensive compared to standard solder balls and are more difficult in providing adequate solder with upper and base substrates, and (4) warpage of the upper and base substrates makes substrate stacking process using thinly coated copper core solder balls increasingly sensitive to process variations and can lead to high manufacturing yield loss.

In other approaches, the active die and an array of electrically conductive vias are mounted to a bottom substrate and encapsulated with mold compound. The conductive vias are exposed subsequently to provide electrical contact pads from top of the mold compound. An interposer substrate is attached to the exposed pads to complete the interconnection with the bottom substrate. An air gap exists between the top interposer substrate and a top surface of the mold compound. However, this approach includes several shortcomings: (1) warpage of the interposer substrate at reflow temperature that can be large thus causing solder joint opening, (2) the total thickness of the package with the interposer and mold compound is increased, and (3) the package requires a through-mold via process that increases assembly costs.

The subject disclosure provides an interposer enabled package-on-package (PoP) structure having a bare die flip chip. The PoP structure of the subject disclosure provides several advantages over conventional approaches including, but not limited to: (1) a low profile package PoP design, (2) reduction of electromagnetic interference (EMI) and providing EMI shielding, (3) thermal performance enhancement technologies for IC packages, (4) electrical performance enhancement technologies for IC packages, and (5) high speed communication applications. In addition, the PoP structure of the subject disclosure is thinner compared to conventional approaches since the adhesive material has a thinner bond-line thickness than structures including a mold compound. Further, the cost of manufacturing is lower than conventional approaches since molding is not necessary and no copper core based solder balls are required.

In some aspects, an integrated circuit (IC) package includes an IC die having a first surface and a second surface opposite of the first surface. The IC package includes first contact members coupled to the second surface of the IC die. The IC package includes a bottom substrate having a first surface and a second surface with the second surface of the bottom substrate being opposite of the first surface of the bottom substrate, where the first surface of the bottom substrate is coupled to the second surface of the IC die via the first contact members. The IC package includes an interposer substrate coupled to the first surface of the IC die via an adhesive material, where the adhesive material is disposed on at least a portion of a surface of the interposer substrate. The IC package includes second contact members coupled along a periphery of the interposer substrate, where the interposer substrate is coupled to the first surface of the bottom substrate via the second contact members.

FIG. 1 illustrates a cross-sectional view of an integrated circuit package 100 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The integrated circuit (IC) package 100 includes IC die 102, bottom substrate 104, and interposer substrate 106. The IC package 100 also includes first electrical contact members 108, second electrical contact members 110, adhesive material 112, third electrical contact members 114, and underfill material 116. The integrated circuit package 100 may be a flip-chip device.

IC die 102, bottom substrate 104 and interposer substrate 106 each have a first surface and a second surface opposite of the first surface. The second surface of IC die 102 includes first electrical contact members 108. The second surface of IC die 102 is coupled to the first surface of bottom substrate 104 via first electrical contact members 108. In this regard, IC die 102 is configured to make electrical contact with bottom substrate 104.

The second surface of IC die 102 may be bonded to the first surface of bottom substrate 104 using underfill material 116. The underfill material 116 may be disposed between the second surface of IC die 102 and the first surface of bottom substrate 104 such that underfill material 116 encapsulates the first electrical contact members 108 and the second surface of IC die 102. The underfill material 116 can be configured to provide mechanical protection (e.g., reduce stress) of first electrical contact members 108. The underfill material 116 may be a capillary underfill (CUF).

The first electrical contact members 108 include multiple conductive bumps (sometimes referred to as solder bumps) that are placed on (or mounted to) the second surface of IC die 102. The second surface of IC die 102 is arranged to face downward and towards the first surface of bottom substrate 104. The first electrical contact members 108 on the second surface of IC die 102 connect directly to bottom substrate 104. The first electrical contact members 108 facilitate electrical connections from the second surface of IC die 102 to the first surface of bottom substrate 104. The first electrical contact members 108 may be densely arranged onto IC die 102. In some aspects, lead-free solder bumps (e.g., tin, silver, copper, tin/silver) as shown in FIG. 1 or copper pillars (not shown) can be used for first electrical contact members 108.

In certain aspects, IC die 102 includes contact pads configured to receive first electrical contact members 108. Because first electrical contact members 108 can be placed directly on the contact pads of the second surface of IC die 102, the electrical interconnection path length from IC die 102 to bottom substrate 104 is substantially reduced. Consequently, the impedance of the electrical interconnection can be reduced substantially and higher speeds for signal transmission between IC die 102 and bottom substrate 104 can be realized.

The second surface of bottom substrate 104 includes third electrical contact members 114. Here, a matrix of solder balls is mounted on the second surface (sometimes referred to as the bottom surface) of bottom substrate 104. The third electrical contact members 114 may be attached to a bottom conductive layer of bottom substrate 104 to facilitate the electrical interconnections between bottom substrate 104 and an external printed circuit board (not shown). In some aspects, third electrical contact members 114 are arranged in a ball grid array on the bottom conductive layer of bottom substrate 104. In comparison, third electrical contact members 114 are less densely arranged than first electrical contact members 108 on the second surface of IC die 102. Each of first electrical contact members 108 on the second surface of IC die 102 is electrically connected to a corresponding one of third electrical contact members 114 through conductive segments in one or more layers in bottom substrate 104 and through one or more electrical vias between the one or more layers of bottom substrate 104.

Interposer substrate 106 is coupled to the first surface of IC die 102 via adhesive material 112. The adhesive material 112 is disposed on at least a portion of a surface (sometimes referred to as the bottom surface) of interposer substrate 106 to bond interposer substrate 106 to the second surface of IC die 102. In this regard, the bond-line thickness can be minimized to approximately in a range of 10 to 20 micrometers (μm) to reduce the total package thickness. The adhesive material 112 can be suitable for a reflow process such that adhesive material 112 can be cured during the reflow process. The adhesive material 112 can be formulated to use a lead-free (Pb-free) solder reflow profile (e.g., temperature change history) for curing.

The interposer substrate 106 includes second electrical contact members 110. The interposer substrate 106 is coupled to the first surface of bottom substrate via second electrical contact members 110. In this regard, interposer substrate 106 and bottom substrate 104 are electrically connected through second electrical contact members 110.

Interposer substrate 106 provides an interface structure for package-to-package vertical interconnection. Interposer substrate 106 includes a first surface (sometimes referred to as the top surface) that may include contact pads for interconnection with other surface mountable components such as Application Specific Integrated Circuits (ASICs) and discrete memory device packages including flip chip and wire bond BGAs, passive components such as capacitors, inductors, electromagnetic coupling baluns, electromagnetic radiators, and resistors. In this regard, the contact pads can be used to connect electronic components for package-to-package electrical interconnections such as package stacking to form PoP stack.

An advantage of the interposer enabled package-on-package (PoP) structure having the bare die flip chip illustrated in FIG. 1 is that the vertical interconnection length between bottom substrate 104 and interposer substrate 106 is substantially shorter than interconnections requiring a mold compound. The adhesive material 112 allows interposer substrate 106 to have a shorter distance to bottom substrate 104. In this regard, interposer substrate 106 provides a low-impedance signal transmission path to IC die 102. The interconnection path length reduction enables high speed communication between IC die 102 mounted on bottom substrate 104 and components (not shown) mounted on interposer substrate 106. Consequently, high speed communication between the bottom substrate 104 and interposer substrate 106 can be achieved.

Because adhesive material 112 provides reinforcement of IC die 102 to the PoP structure, the footprint of the PoP structure can be minimized. In mobile applications such as cell phones, hand-held video and audio players, smaller footprint size of PoP structures can translate into smaller application devices.

Figure 2A:
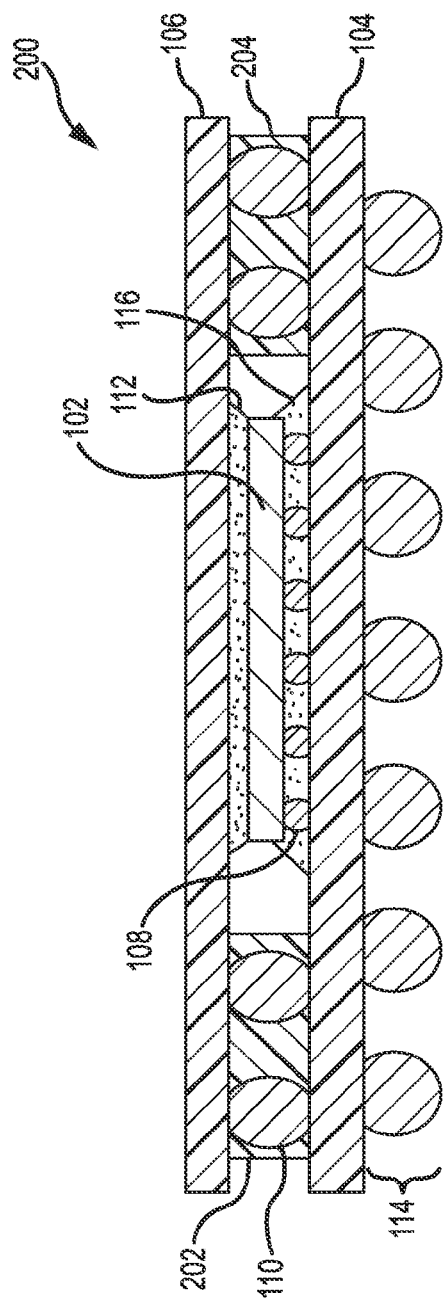
FIGS. 2A-2B illustrate cross-sectional views of examples of the integrated circuit package illustrated in FIG. 1 in accordance with one or more implementations of the subject technology.
Figure 2B:
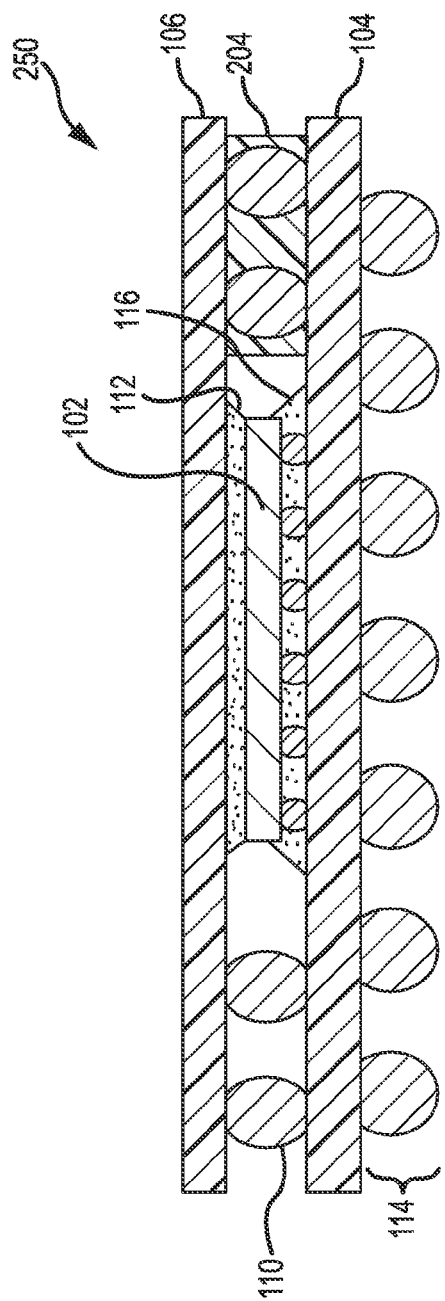

FIGS. 2A-2B illustrate cross-sectional views of examples of the integrated circuit package illustrated in FIG. 1 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Referring to FIG. 2A, IC package 200 includes IC die 102, bottom substrate 104, and interposer substrate 106. The IC package 200 also includes first electrical contact members 108, second electrical contact members 110, adhesive material 112, third electrical contact members 114, and underfill material 116. IC package 200 also includes non-conductive adhesive material 202 and 204. For example, non-conductive paste (NCP) formulated for solder reflow process can be used for 202 and 204. Because IC package 200 is substantially similar to IC package 100 of FIG. 1, only differences will be discussed with respect to FIG. 2A.

Here, a non-conductive adhesive (e.g., 202 and 204) is disposed on one or more portions of the first surface of bottom substrate 104 at a periphery of bottom substrate 104. In some aspects, the periphery includes placement locations of second electrical contact members 110. As such, the adhesive (e.g., 202 and 204) encapsulates second electrical contact members 110.

The surface (e.g., the bottom surface) of interposer substrate 106 makes contact with 202 and 204. Adhesive 202 and 204 may be employed to mechanically bond interposer substrate 106 with bottom substrate 104. In some aspects, adhesive 202 and 204 is inserted between second electrical contact members 110 with interposer substrate 106 coupled to bottom substrate 104 to provide further reinforcement. The non-conductive adhesive may include an epoxy material. The adhesive material 112 may be formed of a same material as the NCP compound.

Referring to FIG. 2B, IC package 250 includes IC die 102, bottom substrate 104, and interposer substrate 106. IC package 250 also includes first electrical contact members 108, second electrical contact members 110, adhesive material 112, third electrical contact members 114, and underfill material 116. IC package 250 also includes non-conductive adhesive 204. Because IC package 250 is substantially similar to IC package 200 of FIG. 2A, only differences will be discussed with respect to FIG. 2B.

Here, adhesive 204 is disposed on a portion of the first surface of bottom substrate 104 that is at the periphery of bottom substrate 104. Adhesive 204 may be inserted between a subset of second electrical contact members 110 to provide further reinforcement at the specified portion of IC package 250.

Figure 3:
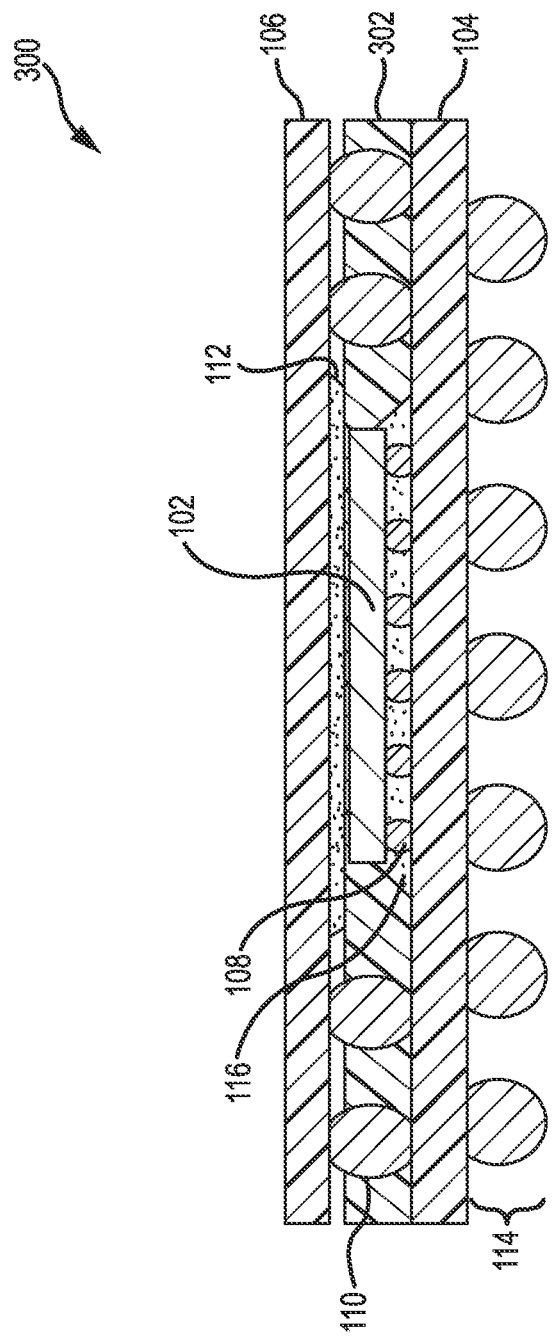
FIG. 3 illustrates a cross-sectional view of an example of the integrated circuit package illustrated in FIG. 1 in accordance with one or more implementations of the subject technology.

FIG. 3 illustrates a cross-sectional view of an example of the integrated circuit package illustrated in FIG. 1 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

IC package 300 includes IC die 102, bottom substrate 104, and interposer substrate 106. The IC package 300 also includes first electrical contact members 108, second electrical contact members 110, adhesive material 112, third electrical contact members 114, and underfill material 116. IC package 300 also includes mold compound 302. Because IC package 300 is substantially similar to IC package 100 of FIG. 1, only differences will be discussed with respect to FIG. 3.

Here, IC package 300 includes mold compound 302 disposed on the first surface of bottom substrate 104 with second electrical contact members extending above a surface (sometimes referred to as a top surface) of mold compound 302. In some aspects, mold compound 302 encapsulates IC die 102. The top surface of mold compound 302 can be drilled, milled, etched, and/or irradiated with a laser beam to remove material of mold compound 302 to form openings and partially expose second electrical contact members 110.

As shown in FIG. 3, adhesive material 112 is disposed on the surface of mold compound 302. As such, the interposer substrate 106 is coupled to the surface of mold compound 302 via adhesive material 112. The adhesive material 112 is disposed where an air gap is present between the top surface of mold compound 302 and the bottom surface of interposer substrate 106. The air gap may be in a range of 3 micrometers (μm) up to 30 μm.

Figure 4:
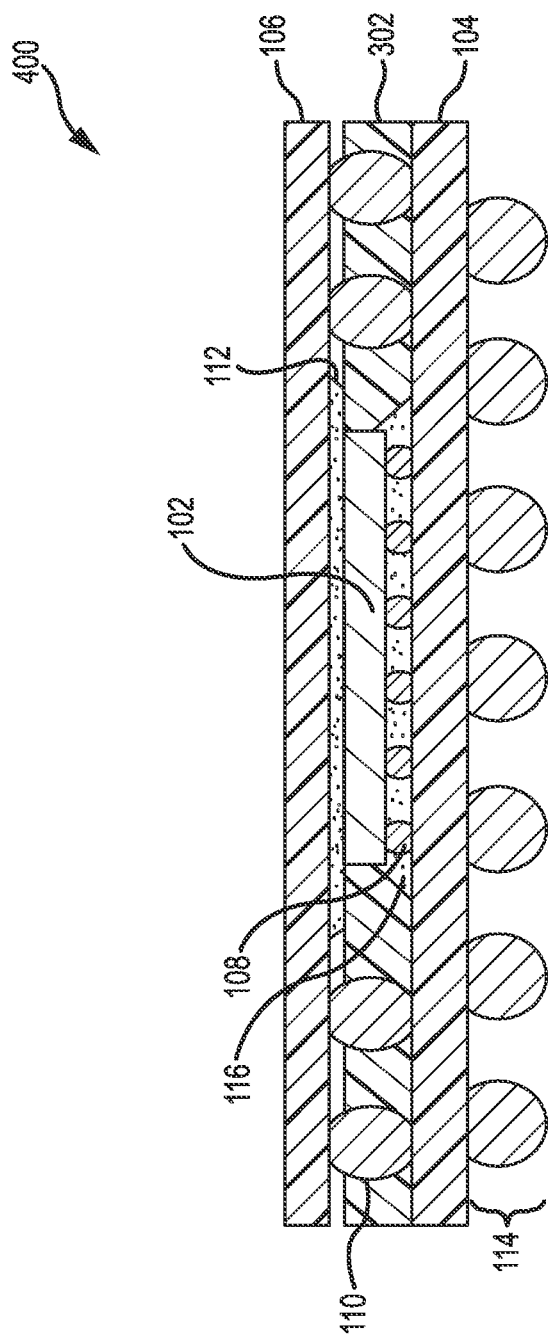
FIG. 4 illustrates a cross-sectional view of an example of the integrated circuit package illustrated in FIG. 3 in accordance with one or more implementations of the subject technology.

FIG. 4 illustrates a cross-sectional view of an example of the integrated circuit package illustrated in FIG. 3 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

IC package 400 includes IC die 102, bottom substrate 104, and interposer substrate 106. The IC package 400 also includes first electrical contact members 108, second electrical contact members 110, adhesive material 112, third electrical contact members 114, and underfill material 116. IC package 400 also includes mold compound 302. Because IC package 400 is substantially similar to IC package 300 of FIG. 3, only differences will be discussed with respect to FIG. 4.

Here, IC package 300 includes mold compound 302 disposed on the first surface of bottom substrate 104 with second electrical contact members 110 extending above a surface (sometimes referred to as a top surface) of mold compound 302. In some aspects, mold compound 302 partially encapsulates IC die 102.

As shown in FIG. 4, adhesive material 112 is disposed on the surface of mold compound 302 including the first surface of IC die 102. As such, the interposer substrate 106 is coupled to the first surface of IC die 102 via adhesive material 112. In some aspects, interposer substrate 106 is coupled to the surface of mold compound 302 and the first surface of IC die 102 via adhesive material 112. The adhesive material 112 is disposed where an air gap is present between the top surface of mold compound 302 and the bottom surface of interposer substrate 106. In some aspects, film assisted molding (FAM) technology is dispensed to cover the first surface of IC die 102.

FIGS. 5A-5B illustrate an example of the integrated circuit package illustrated in FIG. 3 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

FIG. 5A illustrates a cross-sectional view of IC package 500. IC package 500 includes IC die 102, bottom substrate 104, and interposer substrate 106. The IC package 500 also includes first electrical contact members 108, second electrical contact members 110, adhesive material 112, third electrical contact members 114, and underfill material 116. IC package 500 also includes mold compound 302. Because IC package 500 is substantially similar to IC package 300 of FIG. 3, only differences will be discussed with respect to FIG. 5A.

Here, adhesive material 112 is disposed at corner locations on the surface of mold compound 302. In this respect, individual structures of adhesive material 112 are placed at respective corner locations. In some aspects, adhesive material 112 is disposed on the corner locations including additional locations between the corner locations on the periphery of mold compound 302. The adhesive material 112 may be disposed as continuous or sectional structure (not shown) on the outer periphery (e.g., outer side of second electrical contact members 110) of mold compound 302.

FIG. 5B illustrates an exemplary top view of a cross-section of IC package 500 along a B-B' axis. Here, adhesive material 112 is provided as individual structures 502a, 502b, 502c and 502d to provide reinforcement of IC package 500 at the corner locations with minimal amount of adhesive material needed to achieve a thinner PoP structure. The amount of adhesive material 112 needed to create contact between interposer substrate 106 and bottom substrate 104 may be equivalent to the product of the height of the air gap formed between the substrates and the surface area of the respective corner location.

FIGS. 6A-6B illustrate cross-sectional views of examples of the integrated circuit package illustrated in FIG. 1 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Referring to FIG. 6A, IC package 600 includes IC die 102, bottom substrate 104, and interposer substrate 106. The IC package 600 also includes first electrical contact members 108, second electrical contact members 110, adhesive material 602a and 602b, third electrical contact members 114, and underfill material 116. Because IC package 600 is substantially similar to IC package 100 of FIG. 1, only differences will be discussed with respect to FIG. 6A.

As shown in FIG. 6A, adhesive material 602a and 602b are disposed at multiple locations on the first surface of IC die 102. In this respect, there is an air gap formed between the disposed portions of adhesive material 602a and 602b. The adhesive material 602a and 602b may include different patterns, including but not limited to, square-shaped structures, rectangular-shaped structures or circle-shaped structures at each location on the second surface of IC die 102.

Referring to FIG. 6B, adhesive material 604 is disposed on a portion of the first surface of IC die 102. In this respect, adhesive material 604 bonds the portion of the first surface of IC die 102 to interposer substrate 106.

FIGS. 7A-7D illustrate top views of examples of an adhesive material included in the integrated circuit package illustrated in FIG. 1 in accordance with one or more implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

Figure 7A:
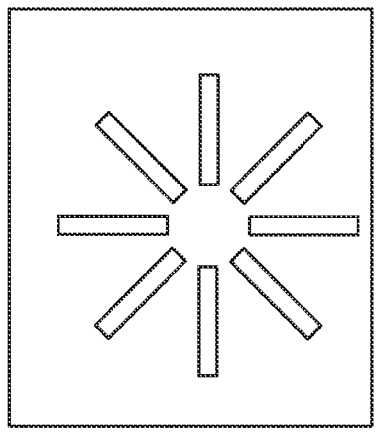
FIGS. 7A-7D illustrate top views of examples of an adhesive material included in the integrated circuit package illustrated in FIG. 1 in accordance with one or more implementations of the subject technology.

Adhesive material 112 may be dispensed in different patterns as illustrated by FIGS. 7A-7D. Referring to FIG. 7A, adhesive material 112 has a pattern that includes multiple intersecting cross-shaped structures. The cross-shaped structures can include different sizes. In this regard, adhesive material 112 is disposed at a center location on the bottom surface of interposer substrate 106 or first surface of IC die 102 depending on implementation.

Figure 7B:
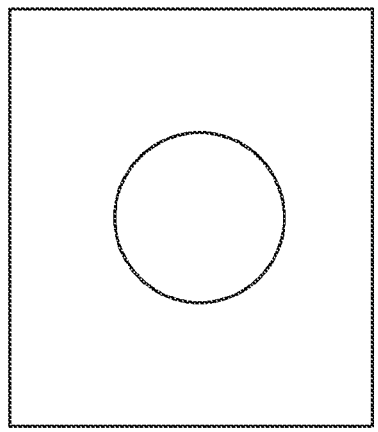

Referring to FIG. 7B, adhesive material 112 has a pattern that includes multiple linear-shaped structures in a circular arrangement. In this regard, adhesive material 112 is deposited at a center location on the bottom surface of interposer substrate 106 or first surface of IC die 102 depending on implementation.

Figure 7C:
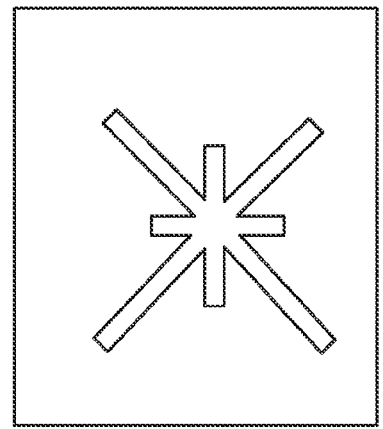

Referring to FIG. 7C, adhesive material 112 has a pattern that includes a plurality of circular-shape structures. In this regard, adhesive material 112 is disposed at corner locations on the first surface of IC die 102 with one circular-shaped structure at a respective corner location. Alternatively, adhesive material 112 can be disposed at corresponding locations of the bottom surface of interposer substrate 106.

Figure 7D:
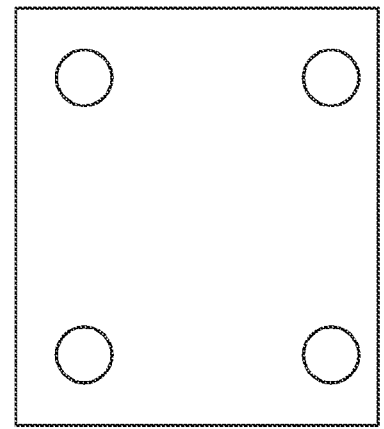

Referring to FIG. 7D, adhesive material 112 has a pattern that includes a circular-shaped structure. In this regard, adhesive material 112 is disposed at a center location of interposer substrate 106 or IC die 102. The different patterns for adhesive material 112 as discussed with regard to FIGS. 7A-7D are applicable to the IC package of FIG. 3.

FIGS. 8A-8F illustrate cross-sectional views of examples in manufacturing the integrated circuit package illustrated in FIG. 1 in accordance with one or more implementations of the subject technology. Although method 800 is described herein with reference to the examples of FIGS. 8A-8F, method 800 is not limited to these examples. Furthermore, although method 800 is illustrated in the order shown in FIGS. 8A-8F, it is understood that method 800 may be implemented in a different order.

Referring to FIG. 8A, method 800 includes a process for coupling first electrical contact members 110 to a first surface of interposer substrate 106. In this regard, first electrical contact members are coupled to a bottom surface (e.g., surface facing down toward IC die 102) of interposer substrate 106. In some aspects, contact pads may be mounted to the first and second surfaces of interposer substrate 106. In this respect, external components can be coupled to the second surface (e.g., top surface) for electrical interconnection with IC die 102.

Referring to FIG. 8B, method 800 includes a process for mounting a first surface of an IC die to a first surface of bottom substrate 104. The IC die 102 includes second electrical contact members 108. In some aspects, method 800 includes a sub-process for mounting second electrical contact members 108 to the first surface of IC die 102. The second electrical contact members 108 can include solder balls, conductive posts such as copper pillars or conductive landing pins.

Referring to FIG. 8C, method 800 includes a process for disposing underfill material 116 between the first surface of IC die 102 and the first surface of bottom substrate 104. In this regard, the underfill material 116 can be non-conductive paste material that encapsulates second electrical contact members 108. The underfill material 116 can be inserted within second electrical contact members 108 with IC die 102 coupled to the first surface of bottom substrate 104.

Referring to FIG. 8D, method 800 includes a process for dispensing adhesive material 112 to a second surface of IC die 102. Here, adhesive material 112 is applied on the entire second surface (or backside surface) of IC die 102. As described above, adhesive material 112 can be applied (or dispensed) onto one or more portions of the second surface of IC die 102. The adhesive material 112 provides reinforcement between IC die 102 and interposer substrate 106, which provides for a low PoP structure profile.

Referring to FIG. 8E, method 800 includes a process for coupling the surface of interposer substrate 106 to the first surface of bottom substrate 104. Here, the second surface of IC die 102 is bonded to at least a portion of the surface of interposer substrate 106 via adhesive material 112. Method 800 includes a process for applying a reflow process with a reflow temperature to at least cure adhesive material 112.

Referring to FIG. 8F, method 800 includes a process for coupling third electrical contact members 114 to a second surface of bottom substrate 104 (e.g., opposite of the first surface of bottom substrate 104). Here, first electrical contact members 110 are electrically connected to third electrical contact members 114 through bottom substrate 104.

FIGS. 9A-9H illustrate cross-sectional views of examples in manufacturing the integrated circuit package illustrated in FIG. 3 in accordance with one or more implementations of the subject technology. Although method 900 is described herein with reference to the examples of FIGS. 9A-9H, method 900 is not limited to these examples. Furthermore, although method 900 is illustrated in the order shown in FIGS. 9A-9H, it is understood that method 900 may be implemented in a different order. Because method 900 is substantially similar to method 800 of FIGS. 8A-8F, only differences will be discussed with respect to FIGS. 9A-9H.

Referring to FIG. 9A, method 900 includes a process for coupling first electrical contact members 110 to a first surface of interposer substrate 106. Referring to FIG. 9B, method 900 includes a process for mounting a first surface of an IC die to a first surface of bottom substrate 104. The IC die 102 includes second electrical contact members 108. In some aspects, method 900 includes a sub-process for mounting second electrical contact members 108 to the first surface of IC die 102. The second electrical contact members 108 can include solder balls, conductive posts or conductive landing pins.

Figure 9C:
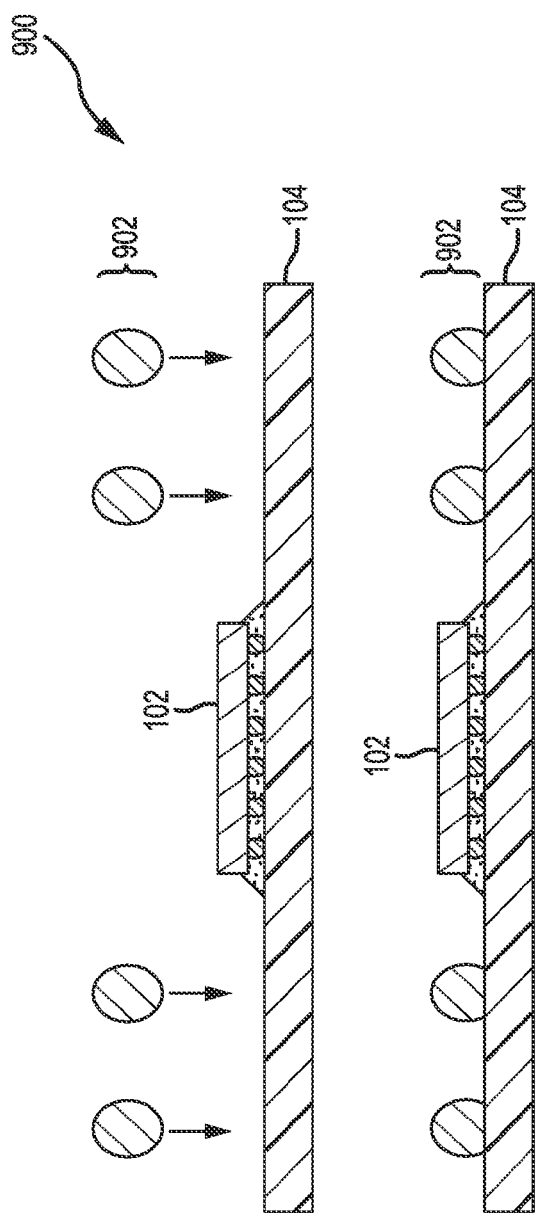

Referring to FIG. 9C, method 900 includes a process for coupling fourth electrical contact members 902 to the first surface of bottom substrate 104. The fourth electrical contact members 902 can include lead-free solder balls.

Figure 9D:
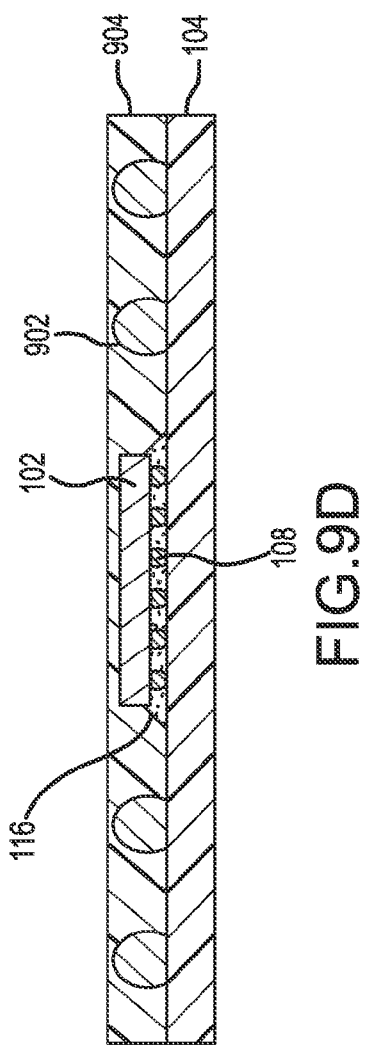

Referring to FIG. 9D, method 900 includes a process for disposing mold compound 904 to the first surface of bottom substrate 104. Here, mold compound 904 encapsulates fourth electrical contact members 902.

Referring to FIG. 9E, method 900 includes a process for applying a laser ablation process 906 to mold compound 302. The laser ablation process may include removing material from mold compound 904 by applying a laser beam to the top surface of mold compound 904. As such, the laser beam irradiates the top surface to create openings or trenches to expose fourth electrical contact members 902. In this regard, one or more portions at the top surface of mold compound 904 located directly above fourth electrical contact members 902 are removed by laser ablation process 906. Other methods, such as mechanical drilling or chemical etching can be used to expose fourth electrical contact members 902.

Referring to FIG. 9F, method 900 includes a process for disposing adhesive material 112 on at least a portion of the surface of mold compound 904. In this respect, the portion of the surface of mold compound 904 disposed with 112 adhesive material is bonded to the surface of interposer substrate 106. The adhesive material 112 can be applied (or dispensed) on one or more portions of mold compound 904 to provide one or more adhesive material structures.

Referring to FIG. 9G, method 900 includes a process for coupling first electrical contact members 110 to fourth electrical contact members 902. In some aspects, first electrical contact members 110 are aligned with fourth electrical contact members 902. Method 900 also includes a sub-process for applying a reflow process to facilitate the coupling of the electrical contact members. In certain implementations, first electrical contact members 110 are infused with fourth electrical contact members 902 during the reflow process to form infused electrical contact members 910. The reflow process may be employed to cure adhesive material 112 to provide a mechanical bonding between mold compound 904 and interposer substrate 106.

Referring to FIG. 9H, method 900 includes a process for coupling third electrical contact members 114 to a second surface of bottom substrate 104 (e.g., opposite of the first surface of bottom substrate 104). Here, infused electrical contact members 910 are electrically connected to third electrical contact members 114 through bottom substrate 104.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An integrated circuit package, comprising:
    an integrated circuit (IC) die;
    an interposer substrate;
    a bottom substrate;
    a mold compound disposed on a first surface of the bottom substrate, the IC die being at least partially encapsulated by the mold compound, the mold compound being coupled to the interposer substrate via adhesive material;
    a first plurality of electrical contact members coupled to the IC die, the IC die being coupled to the first surface of the bottom substrate via the first plurality of electrical contact members;
    a second plurality of electrical contact members coupled to a second surface of the bottom substrate; and
    a third plurality of electrical contact members coupled to the interposer substrate and the first surface of the bottom substrate, at least a portion of the third plurality of electrical contact members extending above the mold compound.

2. The integrated circuit package of claim 1, wherein the IC die is in contact with the adhesive material.

3. The integrated circuit package of claim 1, wherein the adhesive material is disposed within an air gap formed between the IC die and the interposer substrate.

4. The integrated circuit package of claim 1, wherein the IC die is encapsulated by the mold compound, and wherein the IC die is coupled to the interposer substrate via the mold compound and the adhesive material.

5. The integrated circuit package of claim 1, wherein the adhesive material is disposed within an air gap formed between the mold compound and the interposer substrate.

6. The integrated circuit package of claim 1, wherein the adhesive material is disposed on a surface periphery of the mold compound.

7. The integrated circuit package of claim 1, wherein the mold compound has one or more trenches, and wherein at least a portion of the third plurality of electrical contact members is disposed within the one or more trenches.

8. The integrated circuit package of claim 1, further comprising underfill material disposed between the IC die and the first surface of the bottom substrate, the underfill material being in contact with the mold compound.

9. The integrated circuit package of claim 8, wherein the underfill material and the adhesive material are formed of a same material.

10. The integrated circuit package of claim 1, wherein at least a portion of the adhesive material is disposed on a plurality of locations of a surface of the IC die.

11. An integrated circuit package, comprising:
    an integrated circuit (IC) die;
    an interposer substrate;
    a bottom substrate;
    a mold compound disposed on a first surface of the bottom substrate, the mold compound being in contact with the IC die, the interposer substrate being coupled to the mold compound and the IC die via adhesive material;
    a set of conductive posts coupled to the IC die, the IC die being coupled to the first surface of the bottom substrate via the set of conductive posts, the set of conductive posts being encapsulated by underfill material disposed on the bottom substrate;
    a first set of conductive bumps coupled to a second surface of the bottom substrate; and
    a second set of conductive bumps coupled to the interposer substrate and the first surface of the bottom substrate, wherein at least a portion of the second set of conductive bumps extend above the mold compound.

12. The integrated circuit package of claim 11, wherein the IC die is partially encapsulated by the mold compound, and wherein the IC die is in contact with the adhesive material.

13. The integrated circuit package of claim 12, wherein the adhesive material is disposed within an air gap formed between the IC die and the interposer substrate.

14. The integrated circuit package of claim 11, wherein the IC die is encapsulated by the mold compound, and wherein the IC die is coupled to the interposer substrate via the mold compound and the adhesive material.

15. The integrated circuit package of claim 14, wherein the adhesive material is disposed within an air gap formed between the mold compound and the interposer substrate.

16. The integrated circuit package of claim 11, wherein the adhesive material is disposed on a surface periphery of the mold compound.

17. The integrated circuit package of claim 11, wherein the surface of the mold compound has one or more trenches, and wherein at least a portion of the second set of conductive bumps is disposed within the one or more trenches.

18. The integrated circuit package of claim 11, wherein the underfill material is disposed between the IC die and the first surface of the bottom substrate, the underfill material being in contact with the mold compound.

19. The integrated circuit package of claim 11, wherein the underfill material and the adhesive material are formed of a same material.

20. The integrated circuit package of claim 11, wherein the adhesive material is disposed on a plurality of locations of a surface of the mold compound.

\* \* \* \* \*